US006568502B2

(12) United States Patent
Chang

(10) Patent No.: US 6,568,502 B2
(45) Date of Patent: May 27, 2003

(54) SOUNDER, SPEAKER AND SOUND HEAD USING THE SOUNDER

(76) Inventor: Shih Ming Chang, No. 9, Alley 28, Lane 23, Sec. 2, Fudan Rd., Pingjen City, Taoyuan (TW)

( * ) Notice: Subject to any disclaimer, the term of this patent is extended or adjusted under 35 U.S.C. 154(b) by 24 days.

(21) Appl. No.: 09/829,925

(22) Filed: Apr. 11, 2001

(65) Prior Publication Data

US 2002/0148677 A1 Oct. 17, 2002

(51) Int. Cl.[7] .................................................. H05K 5/00

(52) U.S. Cl. ........................ 181/153; 181/155; 181/156

(58) Field of Search ................................ 181/150, 151, 181/152, 153, 148, 154, 155, 163, 156, 161, 157, 165

(56) References Cited

U.S. PATENT DOCUMENTS 4,169,516 A * 10/1979 Honda ........................ 181/150
4,673,057 A * 6/1987 Glassco ...................... 181/144
4,939,935 A 7/1990 Amand
5,962,786 A 10/1999 LeTraon et al.
6,186,269 B1 * 2/2001 Vollmer et al. ............. 181/144

FOREIGN PATENT DOCUMENTS

| | | |
|---|---|---|
| FR | 2685964 | 6/1996 |
| WO | WO93/20413 | 10/1993 |

* cited by examiner

*Primary Examiner*—Kim Lockett
(74) *Attorney, Agent, or Firm*—Bacon & Thomas, PLLC

(57) ABSTRACT

A sounder includes a cone and a sound disk, the cone having a conical peripheral wall with a flat base, the flat base having a diameter smaller than the sound disk, the sound disk being adhered to the conical peripheral wall of the cone and defining with the flat base a sound chamber.

1 Claim, 6 Drawing Sheets

SOUNDER, SPEAKER AND SOUND HEAD USING THE SOUNDER

BACKGROUND OF THE INVENTION

The present invention relates to a sounder adapted for use in speakers, alarms, or horns and, more specifically, to such a sounder, which eliminates the drawbacks of complicated structure, low performance and bulky dimension of conventional speakers that comprise speaker shell, end block, magnet, coil, cone, vibration dust diaphragm, etc.

In the modern society, different voice frequency devices have been disclosed, and are intensively used to transmit voice message. These voice frequency devices include simple sound heads for producing sound and speakers for amplifying sound.

The performance of an audio system depends on the quality of its main unit, amplifier, and speakers. More particularly, the speakers of an audio system determine the quality of output sound. A speaker converts electric voice signal into sound audible to the ears. FIG. 1 illustrates the structure of a conventional speaker. As illustrated, the speaker comprises a casing 10, a paper cone 12, and vibration dust diaphragm 13. The casing 10 comprises an outwardly expanded front bracket 14 and a rear end block 11. The rear end block 11 defines a receiving chamber 15, which receives a magnet 16, and a coil 17 around the magnet 16. The paper cone 12 is adhered to the bracket 14. A gasket ring 19 is adhered to the bracket 14 and a part of the paper cone 12. The paper cone 12 has a hole 18 aimed at the magnet 16. The vibration dust diaphragm 13 is adhered to the paper cone 12 and covered over the hole 18. The coil 17 has lead-out wires 171 extended through the paper cone 12 and connected to power source connector (not shown). After power signal has been transmitted to the magnet 16, different current signals are provided to the magnet 16, causing the magnet 16 to move lefts and rights at different distances, thereby causing the vibration dust diaphragm 13 and the paper cone 12 to vibrate and the produce audible sound. There is known another structure of speaker in which metal voice coil is directly installed in the receiving chamber 15 and adapted to produce sound when electrically connected. These conventional speakers are still not satisfactory in function. The drawbacks of these conventional speakers are outlined hereinafter:

1. Complicated structure: As indicated above, a conventional speaker is comprised of a casing, a magnet, a coil, an end block, a paper cone, a vibration dust diaphragm, and etc. According to conventional designs, the coil acts on the magnet subject to the volume of electric current, causing the magnet to displace, so as to further vibrate the vibration dust diaphragm and the paper cone. A speaker constructed subject to this structure is complicated.
2. Bulky and heavy: The installation of the end block and the magnet greatly increases the weight of the speaker. The end block protrudes over the rear side of the speaker, and adapted to support stable displacement of the magnet. Because the end block supports stable displacement of the magnet, it has a certain weight.
3. Low heat dissipation effect and high sound wave distortion: Because the vibration dust diaphragm seals the receiving chamber to achieve a sound box effect, it prohibits quick dissipation of heat from the receiving chamber, and accumulation of heat may cause distortion of sound waves.

The sound head of a broadcasting or alarm speaker produces sound by means of potential difference. A broadcasting or alarm speaker is portable and, effective to produce high level of sound. FIG. 2 shows a sound head according to the prior art design. As illustrated, an annular rib 23 is provided at the front side of the shell 20 to support a cone 24, and a cover 21 with sound holes 22 is covered on the front side of the shell 20. A sound disk 26 is adhered to the rear end of the cone 24 by bonding glue 25. The sound disk 26 has a circuit (piezoelectric transducer) on it, and lead-out wires 27 for connection to power source. When electrically connected, potential differences cause vibrations to produce sound. Because the sound disk 26 has its center area adhered to the cone 24, the vibration of the sound disk 26 is constrained. Further, because the amplitude of the sound disk 26 is limited and far away from the cone 24, the transmission of sound effect is less efficient.

SUMMARY OF THE INVENTION

The present invention has been accomplished to provide a sounder, which eliminates the drawbacks of the aforesaid conventional designs. According to one aspect of the present invention, the sounder is comprised of a cone and a sound disk. The cone has a conical peripheral wall with a flat base. The flat base has a diameter smaller than the sound disk. The sound disk is adhered to the conical peripheral wall of the cone, defining with the flat base a sound chamber. When used in a speaker, the invention eliminates the installation of an end block in the casing, and therefore the size and weight of the speaker are greatly reduced. The sounder can be used with a cover, a vibration diaphragm, an inner body, a cushion, and cap to form a compact sound head.

DETAILED DESCRIPTION OF THE PREFERRED EMBODIMENT

Figure 1:
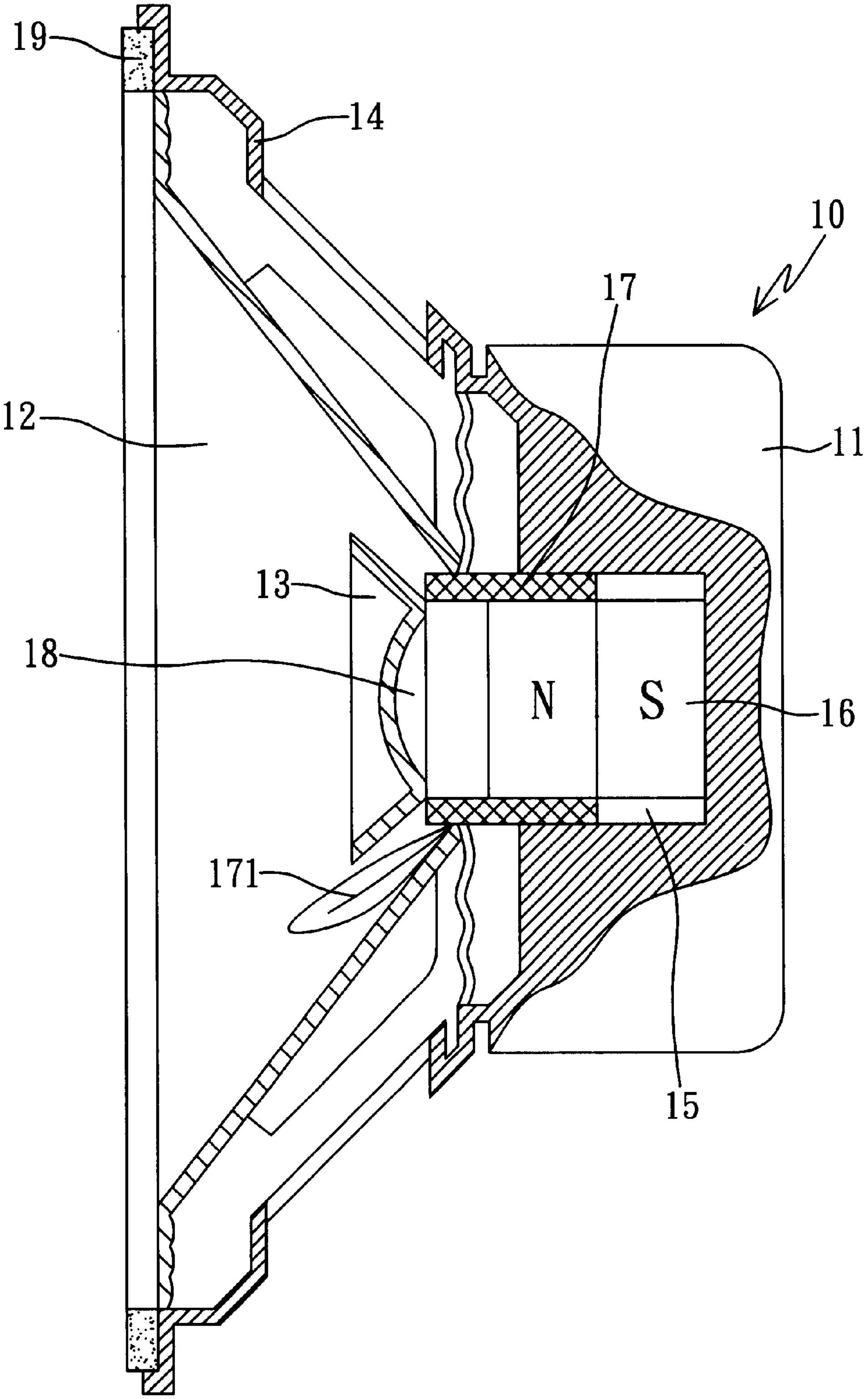
FIG 1 Prior Art
FIG. 1 is a sectional view of a speaker according to the prior art.
Figure 2:
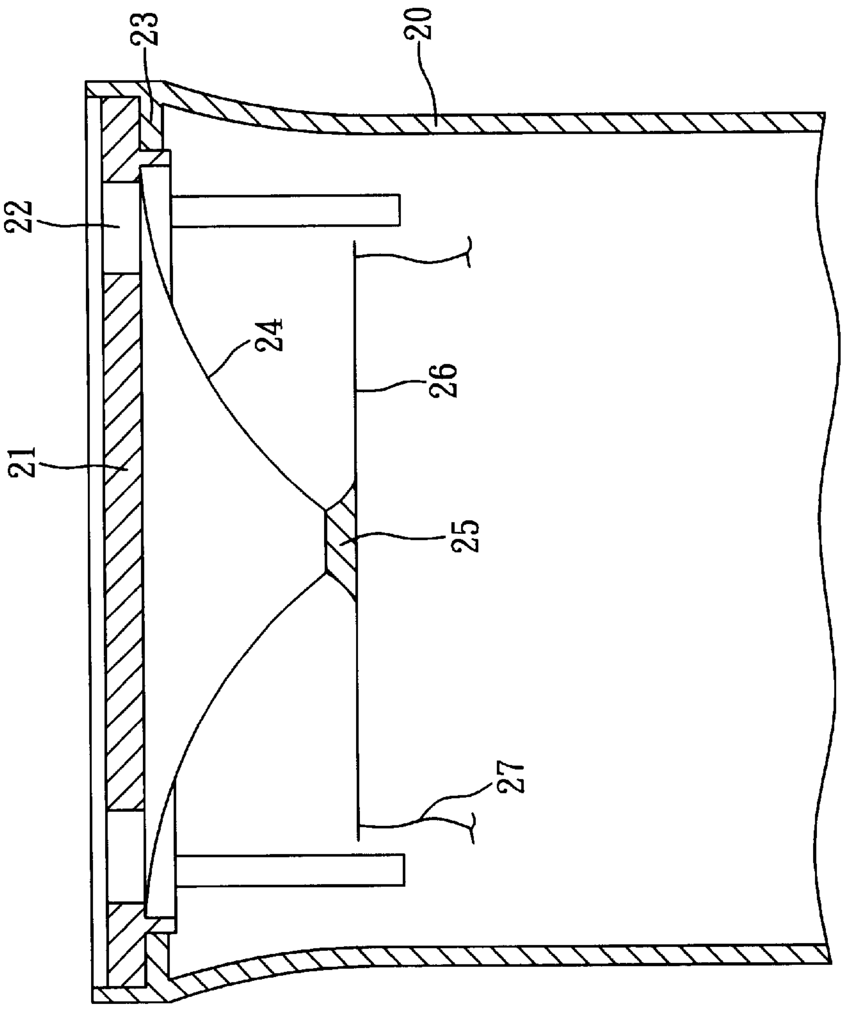
FIG 2 Prior Art
FIG. 2 is a sectional view of a sound head according to the prior art.
Figure 3:
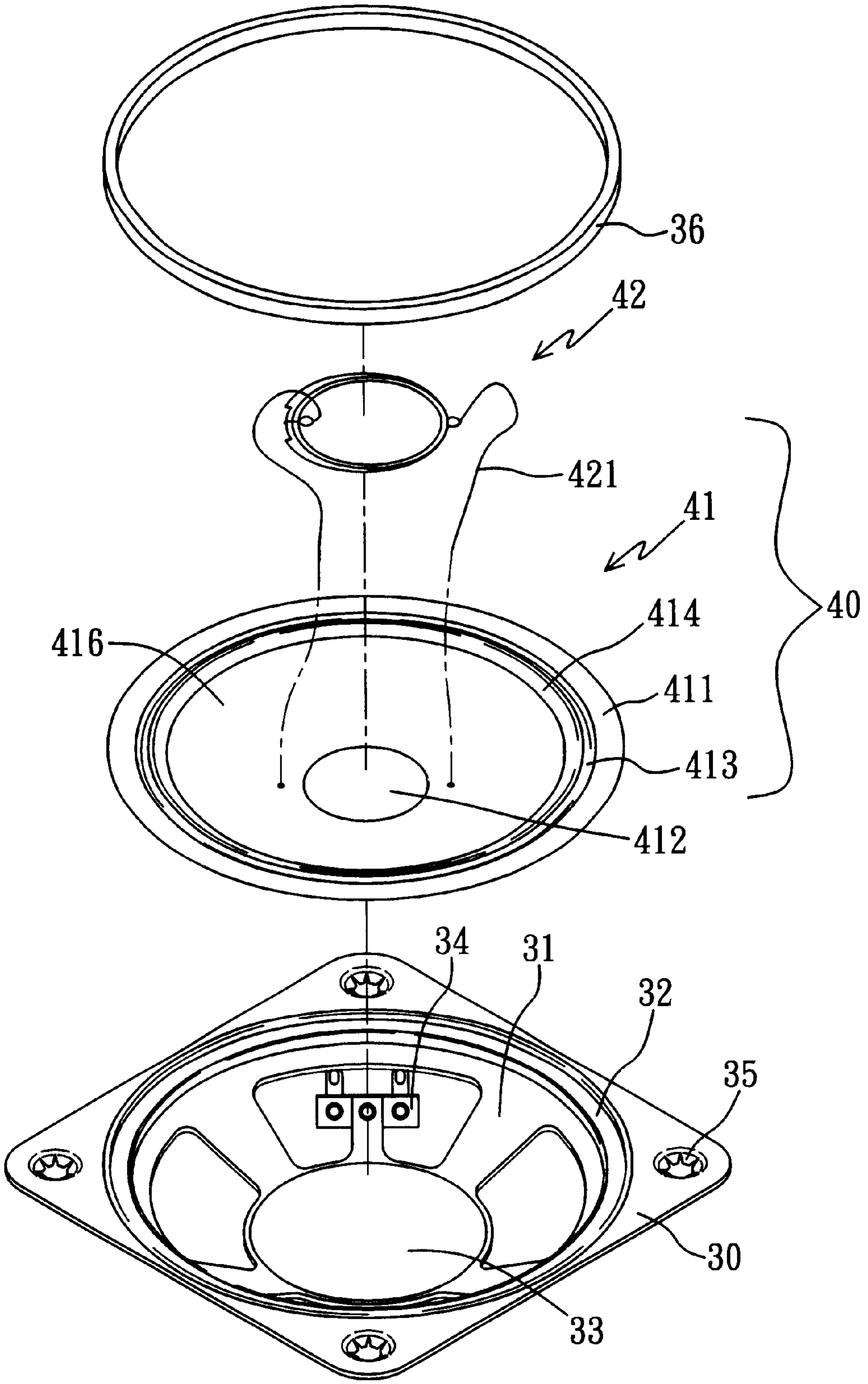
FIG. 3 is an exploded view of a speaker constructed according to the present invention.
Figure 4:
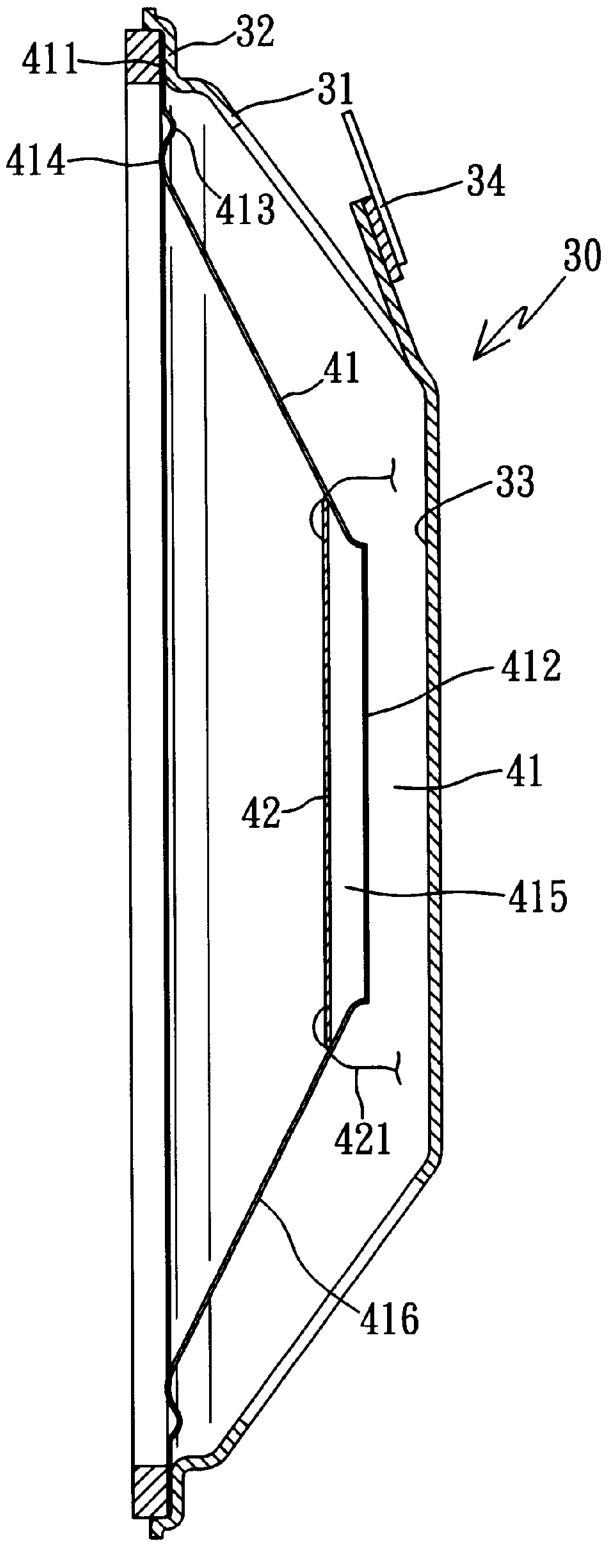
FIG. 4 is a sectional assembly view of the speaker shown in FIG. 3.

Referring to FIGS. 3 and 4, a sounder 40 is accordance with the present invention is shown comprising a casing 30, a gasket ring 36, a cone 41, and a sound disk 42. The cone 41 has a closed base 412 of width smaller than the diameter of the sound disk 42. The sound disk 42 is peripherally adhered to the inner surface of the peripheral wall 416 of the cone 41, defining with the closed base 412 of the cone 41 a sound chamber 415. The lead-out wires 421 of the sound disk 42 extend through the peripheral wall 416 of the cone 41 and connected to an electric connector 34 outside the casing 30. Because the lead-out wires 421 are not extended through the sound chamber 415, the sound chamber 415 is kept airtight. The cone 41 is preferably made from thin sheet of plastic or metal material. The sound disk 42 is a piezoelectric transducer that causes vibration to produce sound subject to variation of potential difference. During variation of potential difference, the metal diaphragm of the sound disk 42 vibrates, causing a high level of sound to be produced in the sound chamber 415, and at the same time the peripheral wall 416 of the cone 41 is vibrated to produce low level of sound.

As stated above, the sounder of the aforesaid first embodiment of the present invention achieves the following advantages.

1. Because the embodiment eliminates the use of magnet, coil, end block, vibration dust diaphragm of the conventional design, the sounder is compact and light.
2. The sounder achieves high performance with less power consumption.
3. Because the sounder does not use a magnet, it produces less heat during operation.
4. Because the sound disk is made from plastics or metal material in integrity, its structure is simple, and consumes only ½~⅓ of power consumption of similar conventional designs.
5. The arrangement of the sound disk and the integrated cone eliminates the use of a conventional vibration dust diaphragm.

Referring to FIGS. 3 and 4 again, the casing 30 comprises a bracket 31 having a flat bottom plane 33. The diameter of the flat bottom plane 33 is greater than the closed base 412 of the cone 41. After installation, the cone 41 does not touch the casing 30, preventing damping of the transmission of sound waves. The cone 41 has an annular peripheral flange 411 adhered to an annular groove 32 in the bracket 31. In order to prevent direct contact of the peripheral wall 416 of the cone 41 with the bracket 31 of the casing 30, the cone 41 is made having a concave portion 413 connected between the peripheral wall 416 and the annular peripheral flange 411. The concave portion 413 forms with the peripheral wall 416 of the cone 41 a turning portion 414 that suspend the peripheral wall 416 of the cone 41 from the annular peripheral flange 411, preventing direct contact of the peripheral wall 416 of the cone 41 with the bracket 31 of the casing 30. The casing 30 has mounting holes 35 in the four corners thereof for mounting in the speaker cabinet (not shown). The gasket ring 36 is pressed on the annular peripheral flange 411 of the cone 41 and fixedly fastened to the casing 30.

Figure 5:
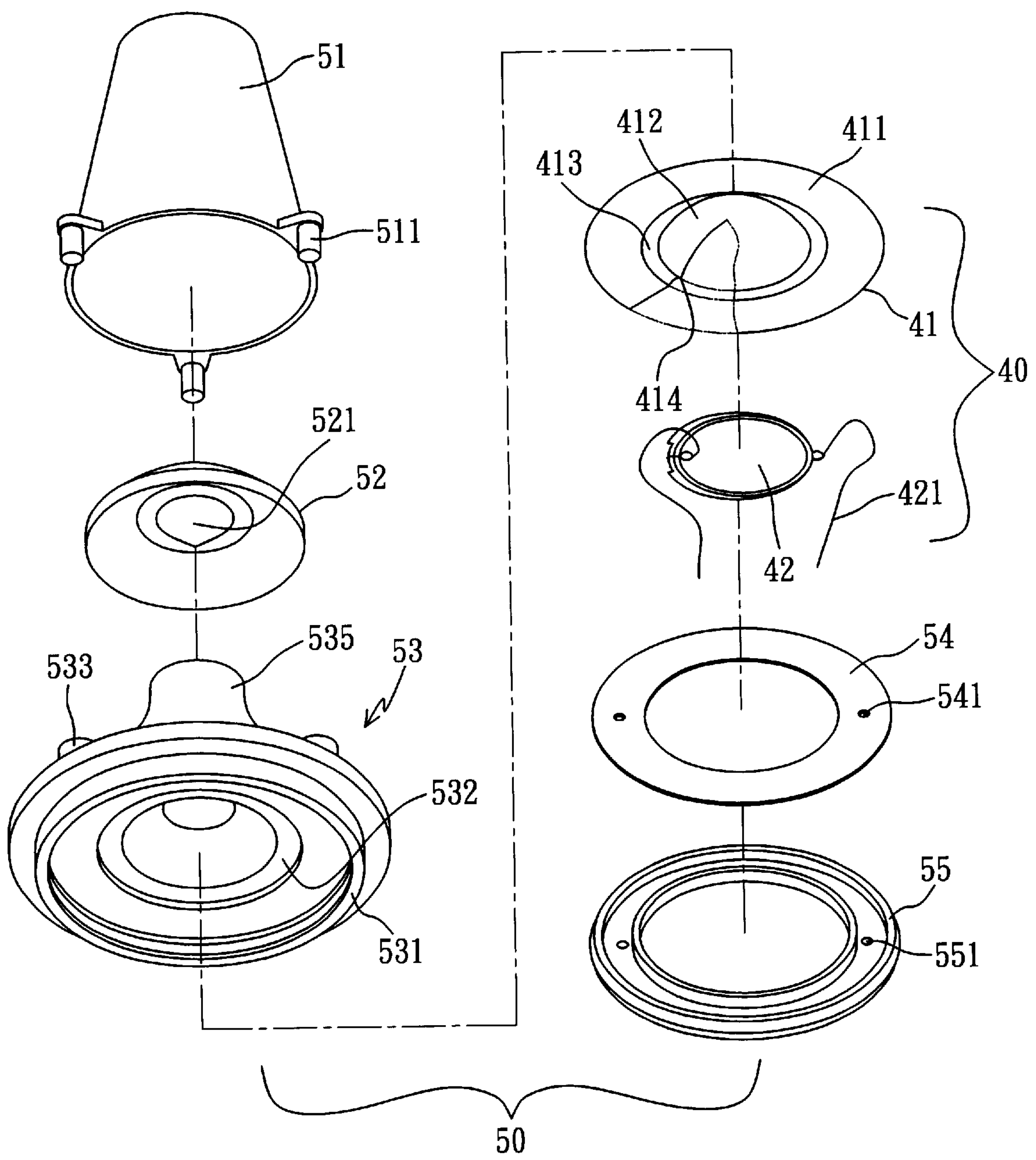
FIG. 5 is an exploded view of a sound head constructed according to the present invention.
Figure 6:
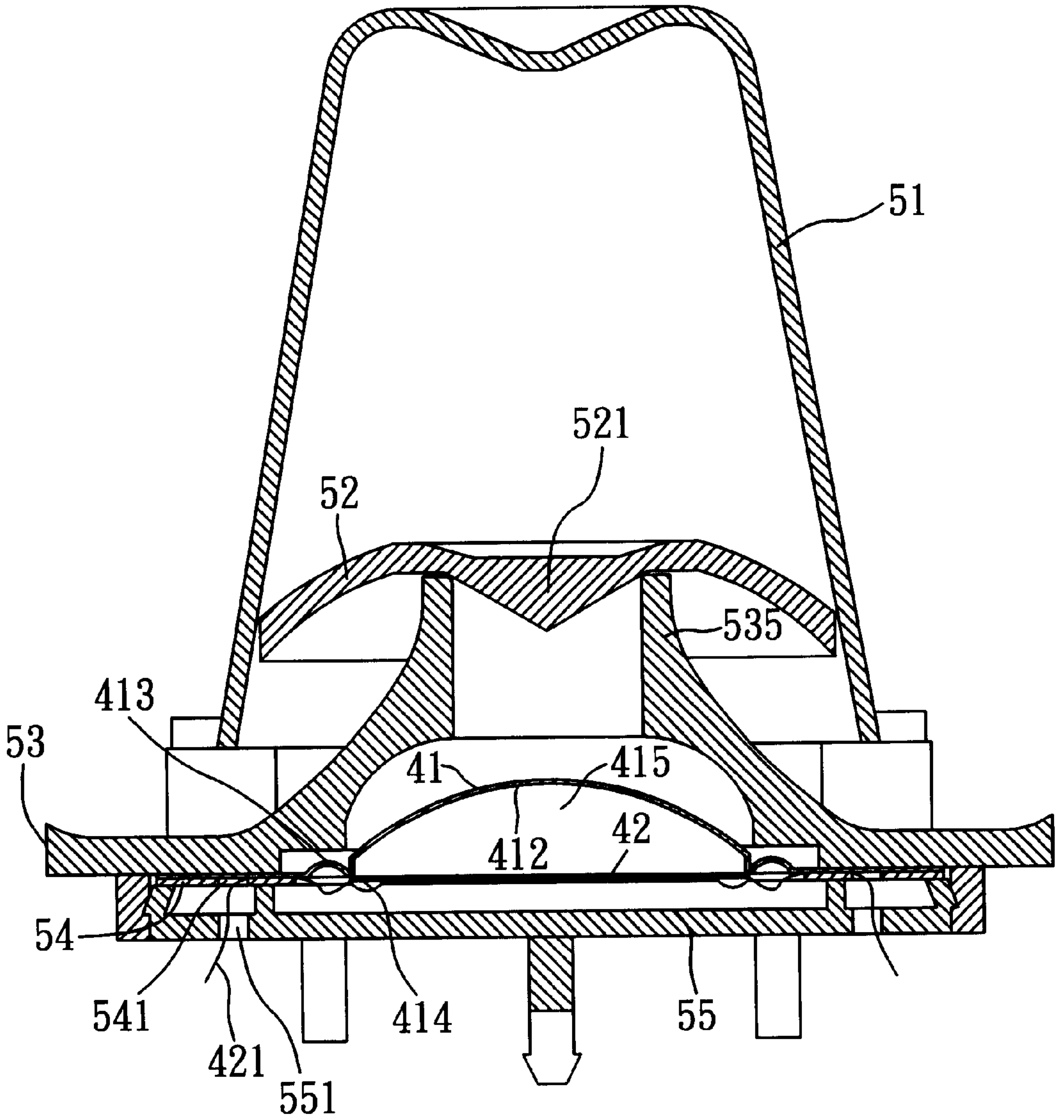
FIG. 6 is a sectional assembly view of the sound head shown in FIG. 5.

FIGS. 5 and 6 show the use of the present invention in a sound head 50. As illustrated, the sound head 50 is comprised of a cover 51, a vibration diaphragm 52, an inner body 53, a sounder 40, a cushion 54, and a cap 55. The cover 51 has mounting legs 511 fastened to respective holes 533 on the inner body 53. The inner body 53 comprises a conical tube 535 covered with the vibration diaphragm 52. The vibration diaphragm 52 has an inwardly protruded conical protruding portion 521 engaged into the conical tube 535 of the inner body 53. The inner body 53 comprises an annular bottom flange 531 coupled to the cap 55, and a stepped center hole 532 aimed at the conical tube 535 and adapted to receive the closed base 412 of the cone 41 of the sounder 40. After installation of the sounder 40, the concave portion 413 is suspending in the stepped center hole 532 of the inner body 53 to isolate the sound chamber 415 defined by the conical tube 535, the stepped center hole 532, the closed base 412 of the cone 41 of the sounder 40, and the sound disk 42. The cushion 54 has two wire holes 541 through which the lead-out wires 421 of the sound disk 42 are inserted and then extended through respective wire holes 551 of the cap 55 to the external control unit. Because the lead-out wires 421 of the sound disk 42 are not extended through the center opening of the cushion 54, they are prohibited from touching the sound disk 42, preventing a short-circuit. Further, because the sound disk 42 is peripherally adhered to the turning portion 414 between the concave portion 413 and the closed base 412 of the cone 41, full amplitude is achieved, i.e., the amplitude area covers the whole area of the sound disk. In order to fit the orifice of the conical tube 535, the close base 412 of the cone 41 is made curved upwards. Under the sound box effect of the vibration diaphragm 52 and the cover 52, vibration waves caused in the sound chamber 415 are intensively transmitted to a long distance.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A sound head comprising:

a cover comprising a plurality of bottom mounting legs;

a vibration diaphragm suspended inside said cover, said vibration diaphragm having a downwardly protruded conical protruding portion at the center thereof;

an inner body supporting said vibration diaphragm, said inner body comprising a plurality of mounting holes, which receives the bottom mounting legs of said cover, a stepped bottom center hole, a top conical tube disposed in communication with said stepped bottom center hole, said top conical tube having an orifice, which receives the downwardly protruded conical protruding portion of said vibration diaphragm, and a downward bottom mounting flange;

a cone mounted in the stepped bottom center hole within the downward bottom mounting flange of said inner body, said cone comprising a conical peripheral wall having a convex base suspending in the stepped bottom center hole of said cone and an annular peripheral flange adhered to said inner body, and a turning portion connected between said convex base and said annular peripheral flange of said cone;

a sound disk adhered to the turning portion of said cone and defining with said convex base of said cone a sound chamber;

a cushion fastened to said inner body to hold down said cone, said cushion comprising wire holes for the passing of lead-out wires of said sound disk; and a cap covered on said inner body over said cushion, said cap having wire holes for the passing of lead-out wires of said sound disk.

* * * * *